(12) United States Patent
Sweet

(10) Patent No.: US 6,978,216 B2
(45) Date of Patent: Dec. 20, 2005

(54) TESTING OF INTEGRATED CIRCUITS FROM DESIGN DOCUMENTATION

(75) Inventor: James D. Sweet, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 60 days.

(21) Appl. No.: 10/703,729

(22) Filed: Nov. 7, 2003

(65) Prior Publication Data

US 2004/0204892 A1 Oct. 14, 2004

Related U.S. Application Data

(60) Provisional application No. 60/457,816, filed on Mar. 26, 2003.

(51) Int. Cl.[7] .............................................. G06F 19/00
(52) U.S. Cl. ...................... 702/118; 702/120; 702/123; 716/18; 703/14; 703/22; 324/765
(58) Field of Search ........................ 702/118, 120, 123, 702/117; 703/14, 22, 23, 13; 716/18; 324/765

(56) References Cited

U.S. PATENT DOCUMENTS 6,336,087 B2 * 1/2002 Burgun et al. ................ 703/15
6,370,493 B1 * 4/2002 Knapp et al. ................. 703/14
6,707,313 B1 * 3/2004 Rohrbaugh et al. ......... 324/765

* cited by examiner

Primary Examiner—Bryan Bui
Assistant Examiner—Hien Vo
(74) Attorney, Agent, or Firm—McAndrews, Held & Malloy, Ltd.

(57) ABSTRACT

One or more methods and systems of validating the operation of one or more register designs are presented. In one embodiment, the system utilizes a processor, an integrated circuit design simulator software, a storage media, a storage device, user interface, and a display. In one embodiment, the method includes executing a set of instructions operating on a register design parameter file to produce an output that is easily incorporated into the integrated circuit design simulator software. The output specifies one or more tests to be performed using the integrated circuit design simulator software. The one or more tests are subsequently performed to validate the register design. The method automates the incorporation of register design parameters into the integrated circuit design simulator software by way of executing a set of instructions that operates on the register design parameter file.

16 Claims, 5 Drawing Sheets

TESTING OF INTEGRATED CIRCUITS FROM DESIGN DOCUMENTATION

RELATED APPLICATIONS/INCORPORATION BY REFERENCE

This application makes reference to and claims priority from U.S. Provisional Patent Application Ser. No. 60/457,816, entitled "Testing of Integrated Circuits from Design Documentation", filed on Mar. 26, 2003, the complete subject matter of which is incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The cost to manufacture an integrated circuit is characterized by a high initial cost of production. It is imperative that a design is thoroughly tested in order to mitigate errors in function or performance. Testing may occur via simulation of the waveforms generated by an integrated circuit using one of many simulation tools; however, such tests do not directly validate the operation of the storage elements or registers in an integrated circuit. More specifically, there is a need for a test that assesses the accuracy of data read from and written into registers. In addition, an assessment of its operational accuracy is beneficial. For example, a read only register should ignore write requests while normal read/write registers should accept both read and write requests.

A drawback to the prior art concerns the method used to validate the registers within a digital integrated circuit. A register's design may be tested by manual input of register parameters in the form of instructions or software code into a simulation tool. In addition, any diagnostic tests have to be performed manually. This often requires a significant knowledge of the language, register testing techniques, and register behavior characteristic of the simulation tool used. Hence, the process may be time consuming and difficult.

Furthermore, there lacks a method to efficiently modify register design parameters and perform subsequent tests as the electronic design changes. Hence, re-testing registers when a minor modification is made to the register design may be painstakingly tedious because it takes a significant amount of time to re-write new test instructions for the simulation tool.

Another disadvantage relates to efficiently documenting changes made to modifications or revisions in register design. When a change is made to a design, the corresponding documentation may not be readily updated.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the invention provide for a system and method to test one or more registers specified in an integrated circuit design. The registers are completely defined by register design parameters that may be stored as a data file. A set of executable instructions is used to operate on the data file to produce an output that is incorporated into an integrated circuit design simulator. The set of executable instructions specifies the types of register tests performed by the integrated circuit design simulator.

In one embodiment, a system for testing a register design of an integrated circuit utilizes a processor, a storage media, a storage device capable of reading and storing data files in the storage media, a data file stored in the storage media, and a set of instructions resident in the storage media. By way of control provided by the processor, the set of instructions operates on the data file to generate an output. The output is used by an integrated circuit simulator software to facilitate the testing of the register design. The processor is used to provide execution and control of the set of instructions, the data file, and the integrated circuit simulator.

In one embodiment, a method of testing a register design of an integrated circuit comprises storing register design parameters into a data file, executing a set of instructions operating on the data file, generating an output file from the execution of the set of instructions, incorporating the output file into an integrated circuit simulator and performing one or more tests of the register design.

In another embodiment, a method to efficiently perform validation testing of registers in an integrated circuit comprises storing register design parameters into a file, executing a set of instructions operating on the file to generate an output, incorporating the output into a design simulation software, and performing the validation testing.

These and other advantages, aspects, and novel features of the present invention, as well as details of illustrated embodiments, thereof, will be more fully understood from the following description and drawings.

DETAILED DESCRIPTION OF THE INVENTION

A method and apparatus for automated testing of one or more registers specified in an integrated circuit design is disclosed. Aspects of the invention may be found in a method to automatically write tests from easily documented register design parameters. The documented register design parameters comprise one or more data files that completely define the register design of the integrated circuit. Aspects of the invention comprise one or more methods to validate the functional operation of the registers and validate the accuracy of the documented register design parameters.

Figure 1:
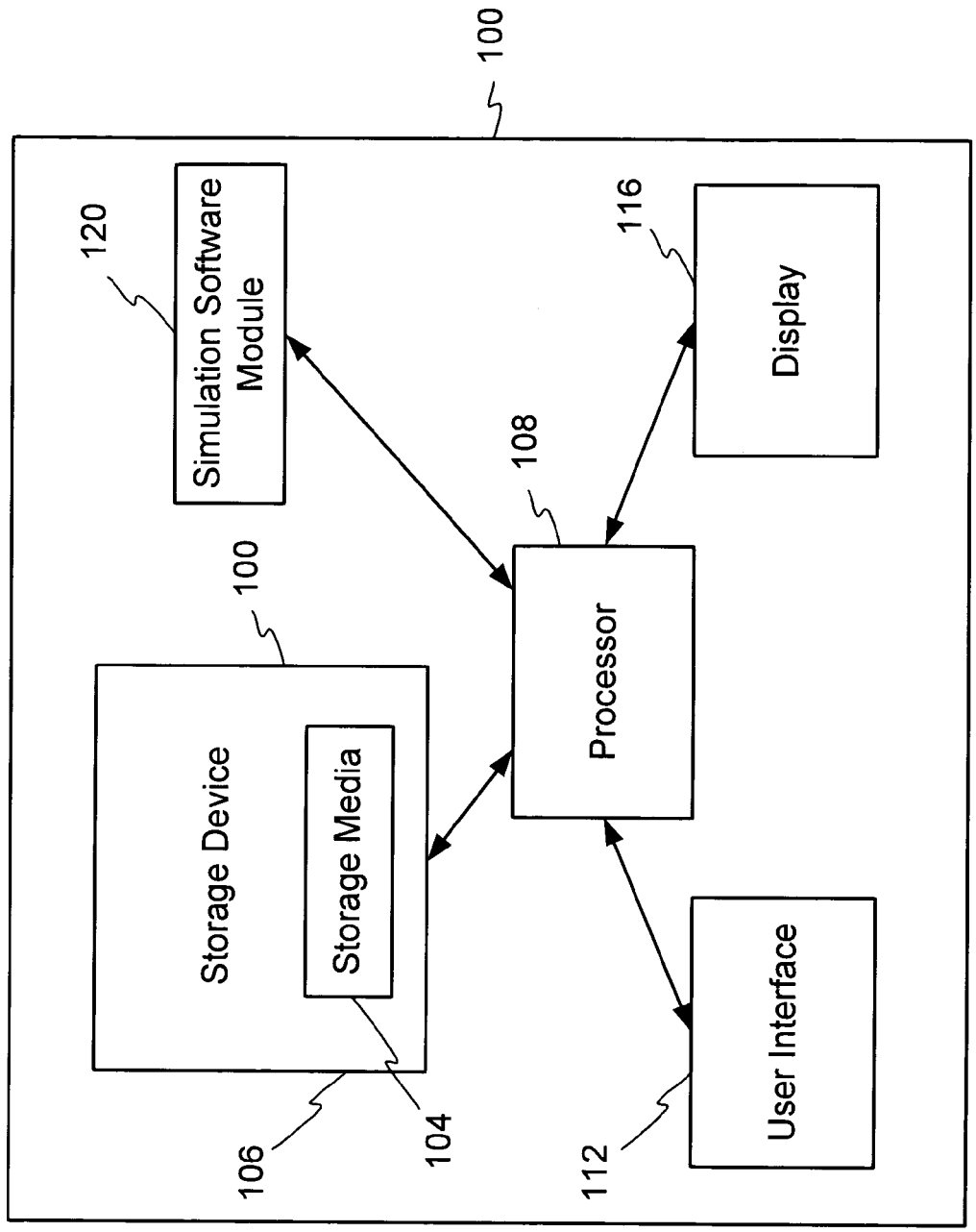
FIG. 1 illustrates a system block diagram in accordance with an embodiment of the present invention.

FIG. 1 illustrates a sample environment and is provided for purposes of discussion and is not in any way intended to limit the scope or breadth of the invention. FIG. 1 describes one embodiment of the invention illustrating a simulation test platform 100 comprising a data storage media 104 resident within its compatible storage device 106, a processor 108, a user interface 112, a display 116, and an integrated circuit simulation software module 120. The simulation test platform 100 may comprise a computer, server, or computer network.

The simulation software module 120 may run a circuit simulation program capable of simulating the designs of integrated circuits in various environments. The simulation test platform 100 allows a circuit designer to assess the performance and operation of a number of different electrical signals pertaining to the integrated circuit prior to manufacture. In an embodiment of the present invention, the simulation test platform 100 comprises a Verilog test platform running Verilog software within the simulation software module 120. It is contemplated other simulation test platforms such as one that runs VHDL software may also be used.

Referring to FIG. 1, the user interface 112 communicates with the processor 108. The processor 108 communicates with the storage device 106 to access the storage media 104 facilitating the execution of software program(s) or sets of computer instructions. In addition, data files resident in the storage media 104 may be accessed by the processor 108 for use by a software program that may reside in the storage device 106. The processor 108 may comprise a processor and/or other electronics configured to provide a suitable environment for simulating integrated circuit designs and executing software programs. The processor 108 interfaces with the display 116 to provide visual information or feedback to the user. The display 116 may comprise a monitor or any device capable of displaying the status of the simulation test platform 100. The simulation software module 120 may access data stored in the storage media 104 of the storage device 106 by way of the processor 108.

An embodiment of the present invention can be implemented as a register test writer software program (RTWSP) comprising sets of instructions or code resident in one or more storage media of one or more simulation test platforms or one or more computers, servers, or computer networks. The RTWSP compiles or operates on a compatible data file herein described as a register design parameter (RDP) file. The RDP file contains data that completely defines the register design of an integrated circuit. The RTWSP and the RDP data file may be generated using any suitable type of computer based language.

Referring to FIG. 1, examples of storage media 104 include a readable or writable magnetic disk of an internal or external hard drive, a CD-ROM, a flash memory, a tape within a tape drive, an optical disk within an optical drive and the like. The data or contents of the storage media 104 may be read or written into by way of the storage device 106. Until required by the simulation test platform 100, the RTWSP and one or more RDP files may be stored in another computer readable memory, for example in another computer's hard disk drive within the same network, or in portable memory such as a CD-ROM or a floppy disk or any other portable storage media for eventual use by the simulation test platform 100. The RTWSP and one or more RDP files may be electronically or wirelessly transferred by way of a local or wide area network connection to the simulation test platform 100 for future use. It is further contemplated that the RTWSP may be executed remotely by another computer, PDA, wireless phone or like device through a network connection to the simulation test platform 100.

A computer, server, network computer, or the simulation test platform 100 illustrated in FIG. 1 generates a register test code (RTC) when the RTWSP executes an RDP file. The RTC is used by the simulation test platform 100 to verify the operation of an integrated circuit chip's registers. In one embodiment, the generated RTC is suitably incorporated into an integrated circuit emulation program such as an exemplary Verilog simulator, VHDL simulator, or the like. An RTC is uniquely characterized by the contents of its RDP file. Hence, a modification of the values of an RDP file will change its corresponding RTC. It is contemplated that the RTWSP may be easily re-configured so that it generates an appropriately formatted RTC suitable for incorporation into the type of simulation test platform 100 used.

Figure 2:
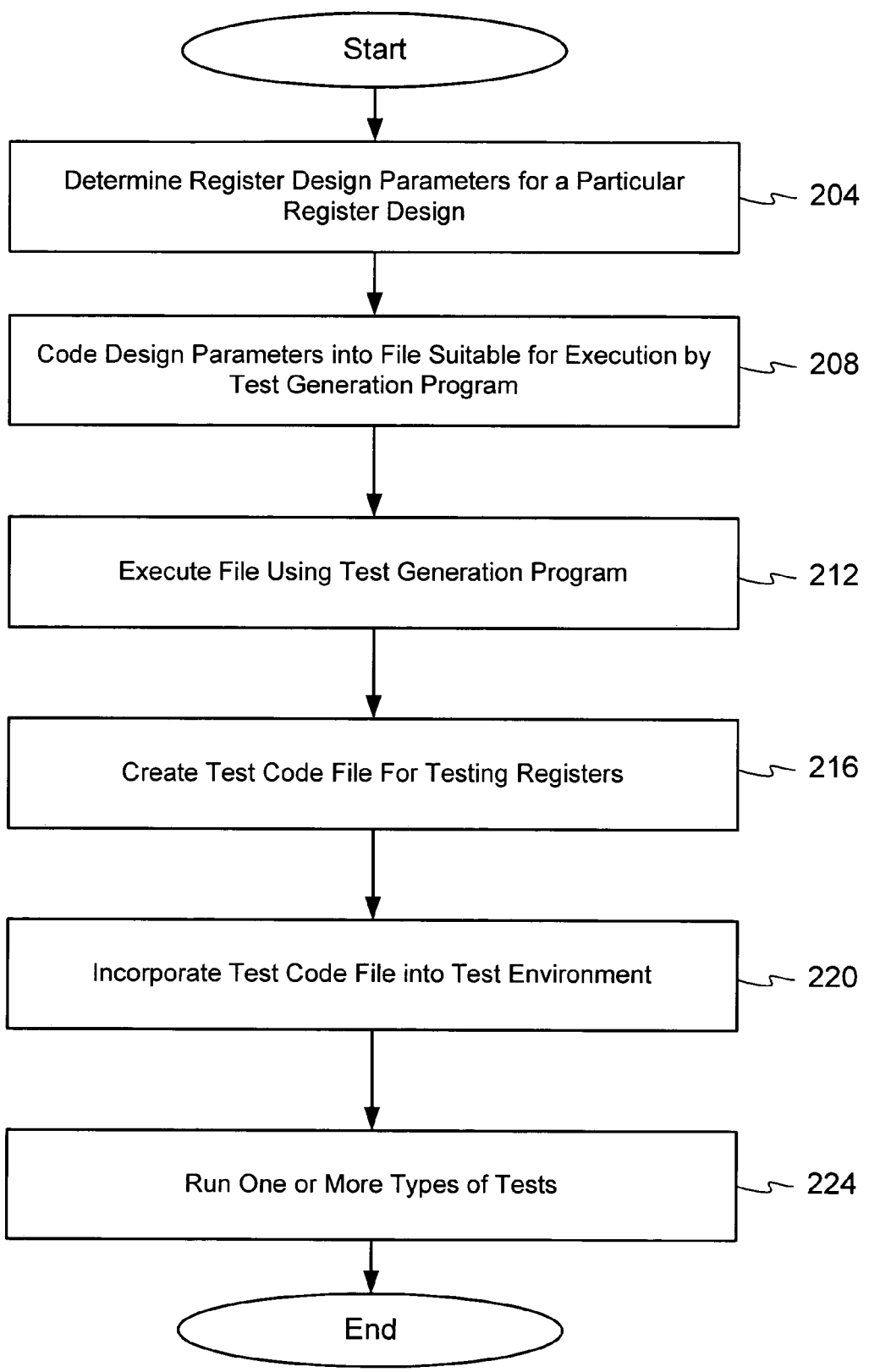
FIG. 2 illustrates an operational flow diagram describing a procedure for generating a register test code (RTC) in accordance with an embodiment of the present invention.

FIG. 2 illustrates an operational flow diagram of a procedure used to generate an RTC. At step 204, register design parameters (RDPs) are determined for a particular register design of an integrated circuit. The RDP may comprise information that characterizes or describes the registers such as number of bits in a register, its address, or its operational functions. Operational functions may comprise functional attributes of the register such as its read only or read and write characteristics.

At step 208, one or more RDPs are documented by the user in an appropriate format and stored as file(s) (with a corresponding filename(s)) that are suitable for use by the RTWSP. The file(s) may be stored in the storage device of the exemplary simulated test platform described in FIG. 1 or any other fixed or portable storage media. The storage media may reside in another computer, server, network computer or like device for suitable access through a network connection.

At step 212, an RDP file is operated on or compiled by the RTWSP using a simple command over a command line interface of a computer, server, network computer, or simulation test platform. For example, a command such as test_writer.pl<rdb_filename>, as referred to in the Appendix, may be input by way of the user interface described earlier in reference to FIG. 1. In this exemplary command, the register test writer software program (test_writer.pl) operates on the register design parameter file named rdb_filename. One or more qualifiers may be appended to the command line such as an exemplary [-verbose] option to control the characteristics of the generated RTC file. When the verbose option is activated, the RTC file provides optional register information as extracted from the RDP file. Other qualifiers may be appended to the exemplary command described previously and the reader is referred to the Appendix for an exemplary list of possible options.

At step 216, the resulting RTC is generated by the RTWSP and at step 220, the file may be incorporated into a simulation test platform such as the embodiment described in FIG. 1. In one embodiment, the RTC is incorporated into a file or set of instructions used by the simulator software. It is contemplated the RTC file may be stored as a file in the storage media of the storage device of the simulation test platform or in storage media at another remote storage device for future use by the simulation test platform.

At step 224, one or more types of register tests may be generated based on the requirements of the testing. It is contemplated that one or more of these tests may be generated by invoking the appropriate options when the RTWSP compiles the RDP file. In this manner, the appropriate register tests may be automatically incorporated during use of the simulation test platform by way of the RTC file that is produced. Exemplary embodiments of methods for register tests are described in the operational flow diagrams illustrated in FIGS. 3–5.

Figure 3:
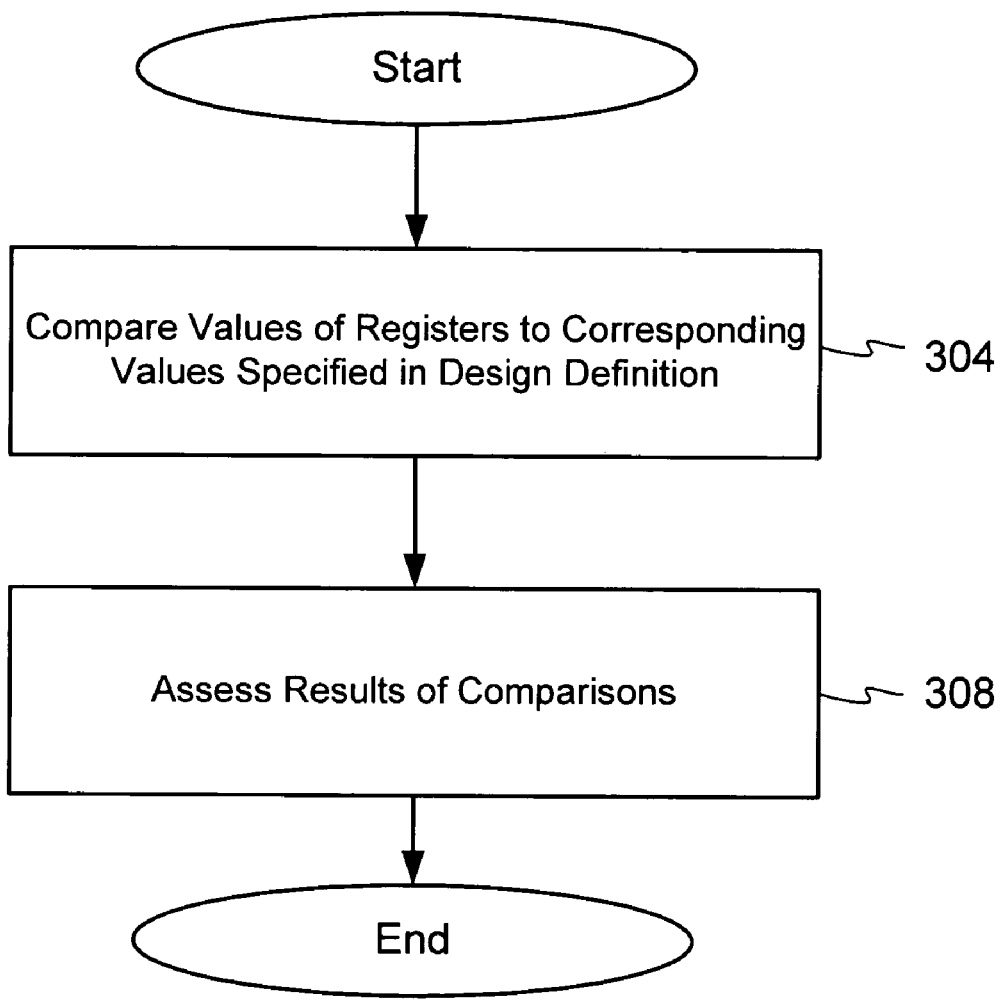
FIG. 3 illustrates an operational flow diagram describing a test methodology for testing registers that are simulated by a simulation test platform in accordance with an embodiment of the present invention.

FIG. 3 illustrates an embodiment of one method for testing the registers simulated by the simulation test platform. The method provides a verification of the initial values stored in the registers. At step 304, the register test provides a comparison of the register parameters represented in the register design with the values documented in the register design parameter (RDP) file. At step 308, the test provides an assessment of any discrepancies resulting from the test. It is contemplated any discrepancies are alerted by way of visual or audible messages to the user. It is further contemplated an errata file including diagnostics in the form of a description of the discrepancy and a suitable cause may be generated as a reference to the user. Upon successful completion of a test, an appropriate message may be sent to the user.

Figure 4:
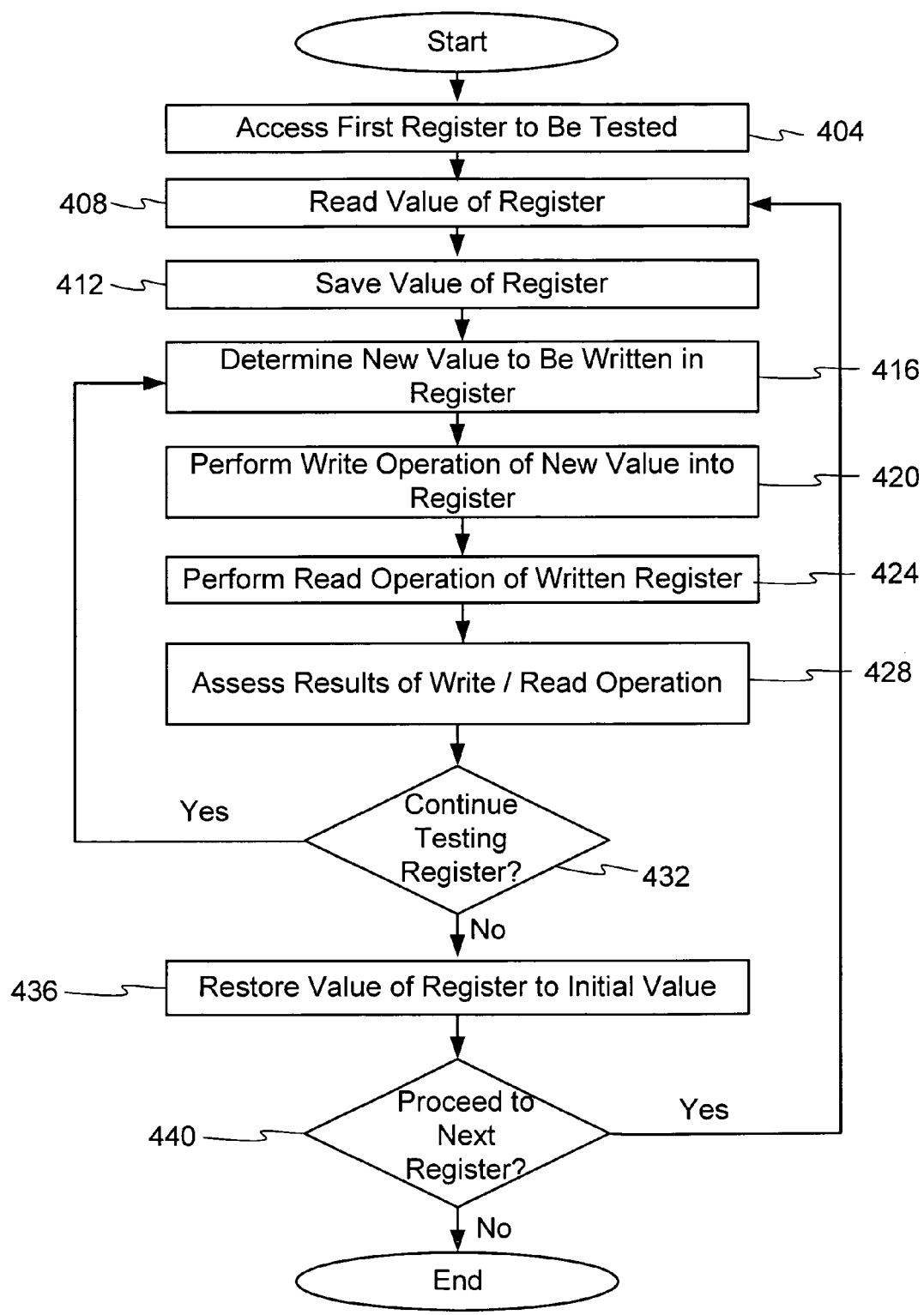
FIG. 4 illustrates an operational flow diagram describing a test methodology for testing registers that are simulated by a simulation test platform in accordance with an embodiment of the present invention.

FIG. 4 illustrates an embodiment of a method for testing the registers simulated by the simulation test platform. In this method, the registers are sequentially verified for functional and operational accuracy. In this embodiment, each register is tested for read and write capability by writing into and reading from the register one or more different values. At step 404, the first register is accessed for testing. At step 408, the initial value of the register is read by a simulation test platform and at step 412, the value is stored in memory such as an exemplary random access memory contained within the simulation test platform. The value is later restored back into the register after the test is completed. At step 416, a new value to be written into the register is determined. At step 420, a write operation is performed using the value determined in step 416. At step 424, a read operation of the value written into the register is performed. At step 428, an assessment is made regarding the accuracy of the read/write operations depending on the type of register. When the register is a read-only, a write operation will not change the value stored within the register, and as a consequence, the value written into register will not correspond to the value read from the register. When the register is capable of read or write, a write operation will change the value stored in the register, and as a consequence, the value written into register should correspond to the value read out of the register. Any discrepancies may signify an error in register design or an error in the register design parameters (RDP) documentation.

At step 432, the test either continues with step 416 or with step 436. It is contemplated that the process reverts to step 416 until all possible values have been tested for a particular register. If testing is continued, the process reverts to step 416 in which a new value is generated. When a register test is completed, at step 436, the value stored in the register is restored to the initial value previously saved at step 412. Then, at step 440, the test proceeds to the next register and the process continues at step 408. The entire process continues until there are no additional registers to test. If the last register has been tested, the process ends. Again, it is contemplated that any discrepancies are alerted to the user and an errata file including diagnostics in the form of a description of the discrepancy and a suitable cause may be generated as a reference to the user. Upon successful completion of a test, an appropriate message may be sent to the user.

Figure 5:
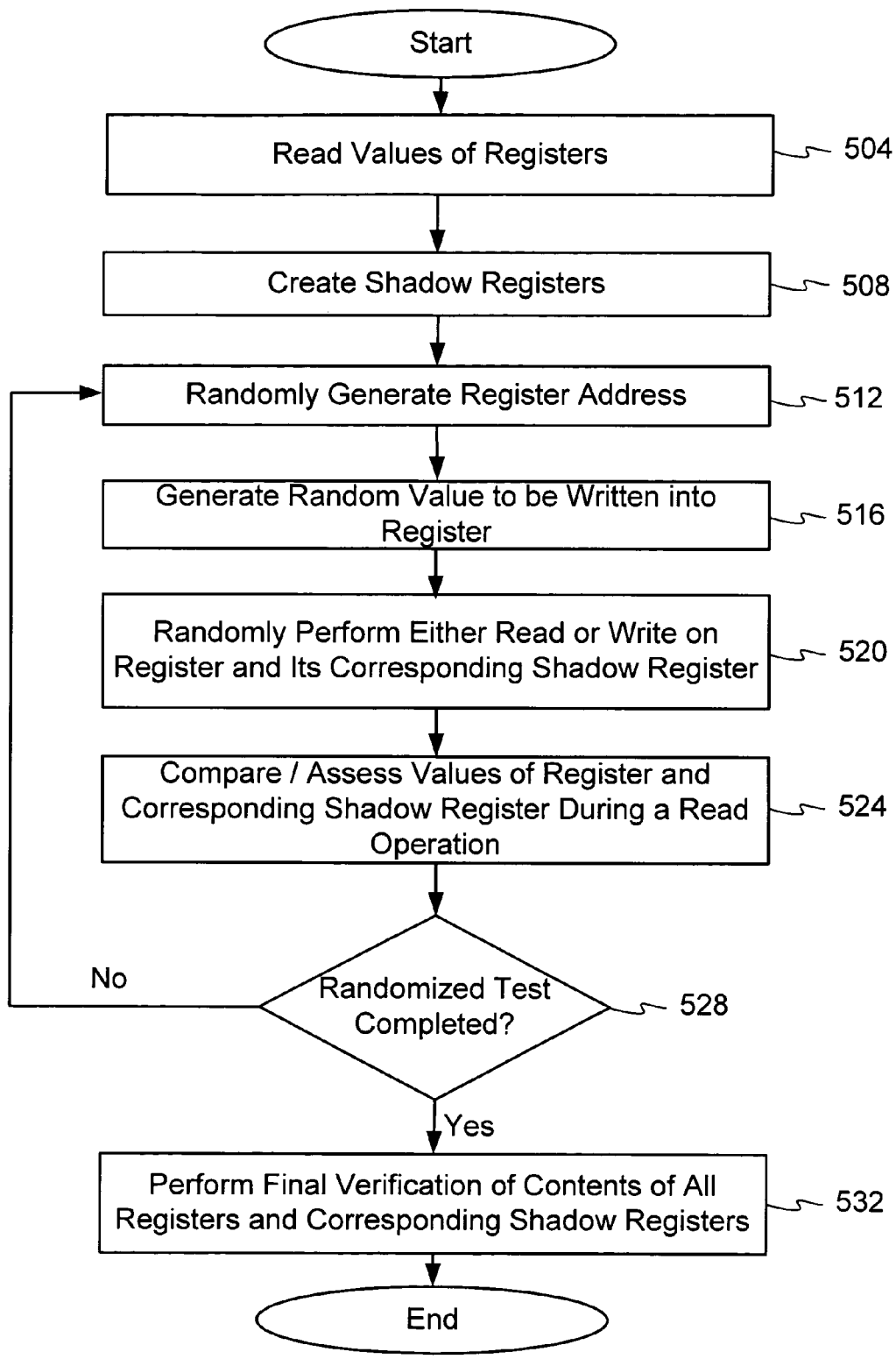
FIG. 5 illustrates an operational flow diagram describing a test methodology for testing registers that are simulated by a simulation test platform in accordance with an embodiment of the present invention.

FIG. 5 illustrates an embodiment of a method of randomly accessing different registers and performing random read or write tests. At steps 504 and 508, the values of all registers are read and stored in a set of "shadow" registers. It is contemplated these "shadow" registers may be an exemplary random access memory, flash memory, or any other type of memory capable of storing data obtained from each register. At step 512, any one of a number of registers is randomly selected and accessed. It is contemplated the selection is performed by way of a random number generator, for example. At step 516, a random value is generated in preparation for a possible write operation. At step 520, either a read or write operation is performed on the randomly selected register and its corresponding "shadow" register. It is contemplated the read or write operation is accomplished randomly by way of another binary random number generator, for example. At step 524, a read operation initiates a comparison between the value stored in the register and the corresponding value stored in the "shadow" register. At step 528, the process loops back to step 512 until all registers have been tested. All registers are read at least once before the test is considered completed. When the randomized testing is completed, the process jumps to step 532 at which a final comparison of values of all registers and their corresponding "shadow" registers are performed. Once again, any discrepancies are alerted to the user and an errata file including diagnostics in the form of a description of the discrepancy and a suitable cause may be generated as a reference to the user. Upon successful completion of a test, an appropriate message may be sent to the user.

In the embodiment described in reference to FIG. 2, the options selected during execution of the RTWSP may enable or disable one or more possible tests. Further, the RTWSP may be configured to test a subset of registers for any test. Of course, other variations on testing registers are possible and are within the scope of this invention.

Advantages of the invention comprise, for example, a method to efficiently perform verification testing from register design parameters that are easily documented. The test not only verifies functionality of the registers but also confirms that the design parameters were documented accurately. Further, the work required to construct a register verification test is reduced, by allowing a register test writer software program (RTWSP) to automate the incorporation of easily revised register design parameters into a circuit design simulation software tool or simulator software (i.e., a circuit or hardware simulation software program) of a simulation test platform. The incorporation of register design parameters into the simulator software is accomplished by executing a set of instructions that operates on the register design parameter file.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

APPENDIX

Syntax and associated descriptions for an exemplary RTWSP, called test_writer.pl, is shown below:

test_writer.pl<rdb_filename>[-verbose] [-base<define>] [-no_intro] [-disable_file<disable_list_filename>] . . . [etc. . . . ]

test_writer.pl TestWriter program written in perl. Run it without any parameters to display the syntax.

<rdb_filename> Name of the source RDB file. This is the only required parameter.

[-verbose] Verbose option. When this option is turned on, TestWriter will print register information as it is extracted from the RDB file. This may be helpful for understanding what information TestWriter used to create the test.

[-base<define>] Name of the define for the base address of the regset. The test needs to know the base address in order to access the registers. Without this command line option, TestWriter puts the following line in the test code: parameter<coreprefix>_BASE='YOUR_BASE_ADDR_HERE'

Before the test will work, the test must be edited to replace the dummy define name shown with the real define for the base address. Alternatively, the "-base" option can be used to make this replacement automatically. The name specified after the "-base" option will be used instead of the dummy name when the test file is created.

[-no_intro] Introductory instructions are not included at the top of the test file.

[-disable_file<file>] Name of the disable list file. The test code includes three sets of parameters that can be used to enable/disable testing of specific registers in each of the three tests. There are also parameters to disable each test entirely. By default, everything is enabled. However, there are frequently registers which require special testing and must be disabled in the standard test. The enables for these registers must be set to 0 in the test file. This can be done by hand after the file is created, or automatically by listing the parameters which should be disabled in a disable list file.

The "-disable_file" option tells TestWriter to read in the specified file and set the parameters listed in the file to 0 when the test is created. This option is not useful for the very first creation of the test because the exact names of the parameters are not known. However, if changes to the RDB require frequent updating of the test, this can be used to avoiding having to hand edit the file after each update.

[-out_file<filename>] Name of the test file to be created. Use this to override the default of "<rdb_file_basename>_reg_test.inc".

[-prefix<coreprefix>] Prefix used to customize names in the test file. Normally, the core prefix in the RDB file is used. However, if there are multiple instances of the same core, this option must be used to make the tests for each instance unique. This file should also be used if the coreprefix is not in the RDB file.

[-include<filename>] Additional file(s) to include. Normally, an additional file is included by writing the "include<filename>" into the RDB file. However, the additional file(s) can be manually included using this option.

What is claimed:

1. A method of testing a register design of an integrated circuit comprising:
    storing register design parameters into a data file;
    executing a set of instructions operating on said data file;
    generating an output file from said execution of said set of instructions;
    incorporating said output file into an integrated circuit simulator software; and
    performing one or more tests on said register design wherein the types of said one or more tests performed is determined by invoking one or more options during execution of said set of instructions.

2. A method of testing a register design of an integrated circuit comprising:
    storing register design parameters into a data file;
    executing a set of instructions operating on said data file;
    generating an output file from said execution of said set of instructions;
    incorporating said output file into an integrated circuit simulator software; and
    performing one or more tests on said register design wherein said one or more tests provides a verification of initial register values of said register design.

3. The method of claim 2 wherein said verification validates said register design parameters.

4. A method of testing a register design of an integrated circuit comprising:
    storing register design parameters into a data file;
    executing a set of instructions operating on said data file;
    generating an output file from said execution of said set of instructions;
    incorporating said output file into an integrated circuit simulator software; and
    performing one or more tests on said resister design wherein said one or more tests generates an errata and diagnostics file.

5. A method of testing a register design of an integrated circuit comprising:
    storing register design parameters into a data file;
    executing a set of instructions operating on said data file;
    generating an output file from said execution of said set of instructions;
    incorporating said output file into an integrated circuit simulator software; and
    performing one or more tests on said register design wherein said one or more tests comprises testing read and write functionality of one or more registers of said register design.

6. A method of testing a register design of an integrated circuit comprising:
    storing register design parameters into a data file;
    executing a set of instructions operating on said data file;
    generating an output file from said execution of said set of instructions;
    incorporating said output file into an integrated circuit simulator software; and
    performing one or more tests on said register design wherein said one or more tests comprises randomly accessing one or more registers of said register design to assess read and write functionality.

7. The method of claim 6 wherein a random number generator is used to randomly access said one or more registers.

8. A method of testing a register design of an integrated circuit comprising:
    storing register design parameters into a data file;
    executing a set of instructions operating on said data file;
    generating an output file from said execution of said set of instructions;
    incorporating said output file into an integrated circuit simulator software; and
    performing one or more tests on said register design; and
    verifying whether said parameters of said register design are documented accurately.

9. A method of testing a register design of an integrated circuit comprising:

storing register design parameters into a data file;
executing a set of instructions operating on said data file;
generating an output file from said execution of said set of instructions;
incorporating said output file into an integrated circuit simulator software; and
performing one or more tests on said register design wherein said execution of said set of instructions automates the incorporation of said register design parameters into said integrated circuit simulator software.

10. A system for testing a register design of an integrated circuit comprising:
   at least one storage media;
   a data file stored in said at least one storage media;
   a set of instructions resident in said at least one storage media, said set of instructions generating an output by operating on said data file, said output used by an integrated circuit simulator software to facilitate said testing of said register design; and
   a processor to provide execution and control of said set of instructions, said data file, and said integrated circuit simulator software, said testing of said register design performed by invoking one or more options during said execution of said set of instructions.

11. The system of claim 10 wherein said execution of said set of instructions provides a verification of initial register values of said register design.

12. The system of claim 10 wherein said execution of said set of instructions generates an errata and diagnostics file.

13. The system of claim 10 wherein said execution of said set of instructions comprises testing read and write functionality of one or more registers of said register design.

14. The system of claim 10 wherein said execution of said set of instructions comprises randomly accessing one or more registers of said register design to assess read and write functionality.

15. The system of claim 10 wherein said execution of said set of instructions comprises verifying whether one or more parameters of said register design are documented accurately.

16. The system of claim 10 wherein said execution of said set of instructions automates the incorporation of one or more register design parameters into said integrated circuit simulator software.

* * * * *